(12) United States Patent
Natori et al.

(10) Patent No.: US 7,259,094 B2
(45) Date of Patent: Aug. 21, 2007

(54) APPARATUS AND METHOD FOR HEAT TREATING THIN FILM

(75) Inventors: Katsuaki Natori, Yokohama (JP); Keisuke Nakazawa, Tokyo (JP); Koji Yamakawa, Tokyo (JP); Hiroyuki Kanaya, Yokohama (JP); Yoshinori Kumura, Yokohama (JP); Hiroshi Itokawa, Yokohama (JP); Osamu Arisumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/110,933

(22) Filed: Apr. 21, 2005

(65) Prior Publication Data

US 2005/0186767 A1    Aug. 25, 2005

Related U.S. Application Data

(62) Division of application No. 10/410,153, filed on Apr. 10, 2003, now abandoned.

(30) Foreign Application Priority Data

Feb. 10, 2003  (JP) .............................. 2003-032426

(51) Int. Cl.
*H01L 21/44*  (2006.01)
*C23C 16/00*  (2006.01)

(52) U.S. Cl. ...................... 438/660; 438/509; 438/522; 118/725

(58) Field of Classification Search ................ 438/660, 438/509, 522; 118/725
See application file for complete search history.

(56) References Cited

U.S. PATENT DOCUMENTS

| | | | | |
|---|---|---|---|---|
| 4,425,143 A | * | 1/1984 | Nishizawa et al. | ........... 95/126 |
| 5,413,866 A | * | 5/1995 | Baker et al. | ............. 423/447.2 |
| 5,866,263 A | * | 2/1999 | Hogan et al. | ............... 428/457 |
| 6,183,566 B1 | * | 2/2001 | Lawing et al. | ................. 134/1 |
| 6,818,783 B2 | * | 11/2004 | Norman et al. | ............. 556/112 |

FOREIGN PATENT DOCUMENTS

| | | |
|---|---|---|
| JP | 11-40748 | 2/1999 |
| JP | 2002-91539 | 3/2000 |
| WO | WO97/15069 | 4/1997 |

OTHER PUBLICATIONS

Sugino et al., "Dry Cleaning of Si and SiO2 Surfaces using SiC14 System", 1995 Symposium on Semiconductor Manufacturing 1995, IEEE, pp. 262-265.
Koujien, edited by I. Nimura, 1st version, Iwanami Shoten, dated Mar. 10, 1968.

* cited by examiner

*Primary Examiner*—Matthew Smith
*Assistant Examiner*—Nicholas J. Tobergte
(74) *Attorney, Agent, or Firm*—Oblon, Spivak, McClelland, Maier & Neustadt, P.C.

(57) ABSTRACT

An apparatus for manufacturing a semiconductor device is disclosed which comprises a chamber which holds a to-be-processed substrate having a film containing at least one kind of metal element which will become a component of a volatile metal compound, a heater which heats the substrate held in the chamber, and an adsorbent which is provided in the chamber and which adsorbs the volatile metal compound generated from the film by heating the substrate.

15 Claims, 4 Drawing Sheets

APPARATUS AND METHOD FOR HEAT TREATING THIN FILM

CROSS-REFERENCE TO RELATED APPLICATIONS

This application is a division of and claims the benefit of priority under 35 USC §120 from U.S. Ser. No. 10/410,153, filed Apr. 10, 2003 now abandoned, and is based upon and claims the benefit of priority under 35 USC §119 from Japanese Patent Application No. 2003-032426, filed Feb. 10, 2003, the entire contents of which are incorporated herein by reference.

BACKGROUND OF THE INVENTION

1. Field of the Invention

The present invention relates to a thermal treatment process in the manufacturing process of semiconductor devices. In particular, the present invention relates to apparatus and method for manufacturing a semiconductor device, which are applied to a heating process when forming electrodes of FeRAM capacitor devices using metal oxide.

2. Description of the Related Art

For instance, in one kind of semiconductor devices, that is, FeRAM (Ferroelectric Random Access Read Memory), the insulating film of capacitor device is formed using oxide ferroelectric material film in order to achieve the number of $10^{12}$ rewritable times or more. For example, PZT (Pb—Zr—Ti—O) is given as the above oxide ferroelectric material film. In addition, in the FeRAM, the electrode of the capacitor device is formed using metal oxide conductor in order to prevent the degradation of electrical characteristics of the oxide ferroelectric material film. For example, SRO ($SrRuO_3$) is given as the above metal oxide conductor. The SRO is crystallized, thereby having conductivity. In order to crystallize the SRO, heat treatment process is required when forming SRO electrode.

However, one component of the SRO, that is, Ru is easy to generate a volatile substance, that is, $RuO_4$ in the heat treatment process of the SRO electrode. The generated $RuO_4$ is decomposed after adhering to the surface of the SRO electrode (SRO film); as a result, $RuO_X$ crystal particles (abnormal particles) are generated on the surface of the SRO film, as shown in FIG. 4. The above $RuO_X$ crystal particles have a diameter of about 0.5 µm or more. For this reason, it is almost impossible to remove the $RuO_X$ crystal particles from the SRO electrode by after-cleaning. As a result, the $RuO_X$ crystal particles on the SRO electrode has a possibility of causing the operation failure of the capacitor. In addition, the $RuO_X$ crystal particles have a possibility of reducing semiconductor device performance, quality and reliability. Consequently, the $RuO_X$ crystal particles are a factor of reducing semiconductor device yield, and thus, increasing the manufacturing cost of semiconductor devices.

BRIEF SUMMARY OF THE INVENTION

According to an aspect of the present invention, there is provided an apparatus for manufacturing a semiconductor device, comprising: a chamber which holds a to-be-processed substrate having a film containing at least one kind of metal element which will become a component of a volatile metal compound; a heater which heats the substrate held in the chamber; and an adsorbent which is provided in the chamber and which adsorbs the volatile metal compound generated from the film by heating the substrate.

According to another aspect of the present invention, there is provided a method of manufacturing a semiconductor device, comprising: providing an adsorbent in a chamber holding a to-be-processed substrate and heating the substrate, the substrate having a film containing at least one kind of metal element which will become a component of a volatile metal compound; and causing the adsorbent to adsorb the volatile metal compound generated from the film by heating the substrate.

According to a further aspect of the present invention, there is provided a semiconductor device comprising: a semiconductor substrate having a film containing at least one kind of metal element which will become a component of a volatile metal compound, the semiconductor substrate having being heated by an apparatus for manufacturing a semiconductor device, the apparatus comprising: a chamber which holds the semiconductor substrate; a heater which heats the semiconductor substrate held in the chamber; and an adsorbent which is provided in the chamber and which adsorbs the volatile metal compound generated from the film by heating the semiconductor substrate.

According to yet another aspect of the present invention, there is provided a semiconductor device comprising: a semiconductor substrate having a film containing at least one kind of metal element which will become a component of a volatile metal compound, the semiconductor substrate having being heated by a method of manufacturing a semiconductor device, the method comprising: providing an adsorbent in a chamber holding the semiconductor substrate and heating the semiconductor substrate; and causing the adsorbent to adsorb the volatile metal compound generated from the film by heating the semiconductor substrate.

DETAILED DESCRIPTION OF THE INVENTION

Embodiments of the present invention will be described below with reference to the accompanying drawings.

Figure 1:
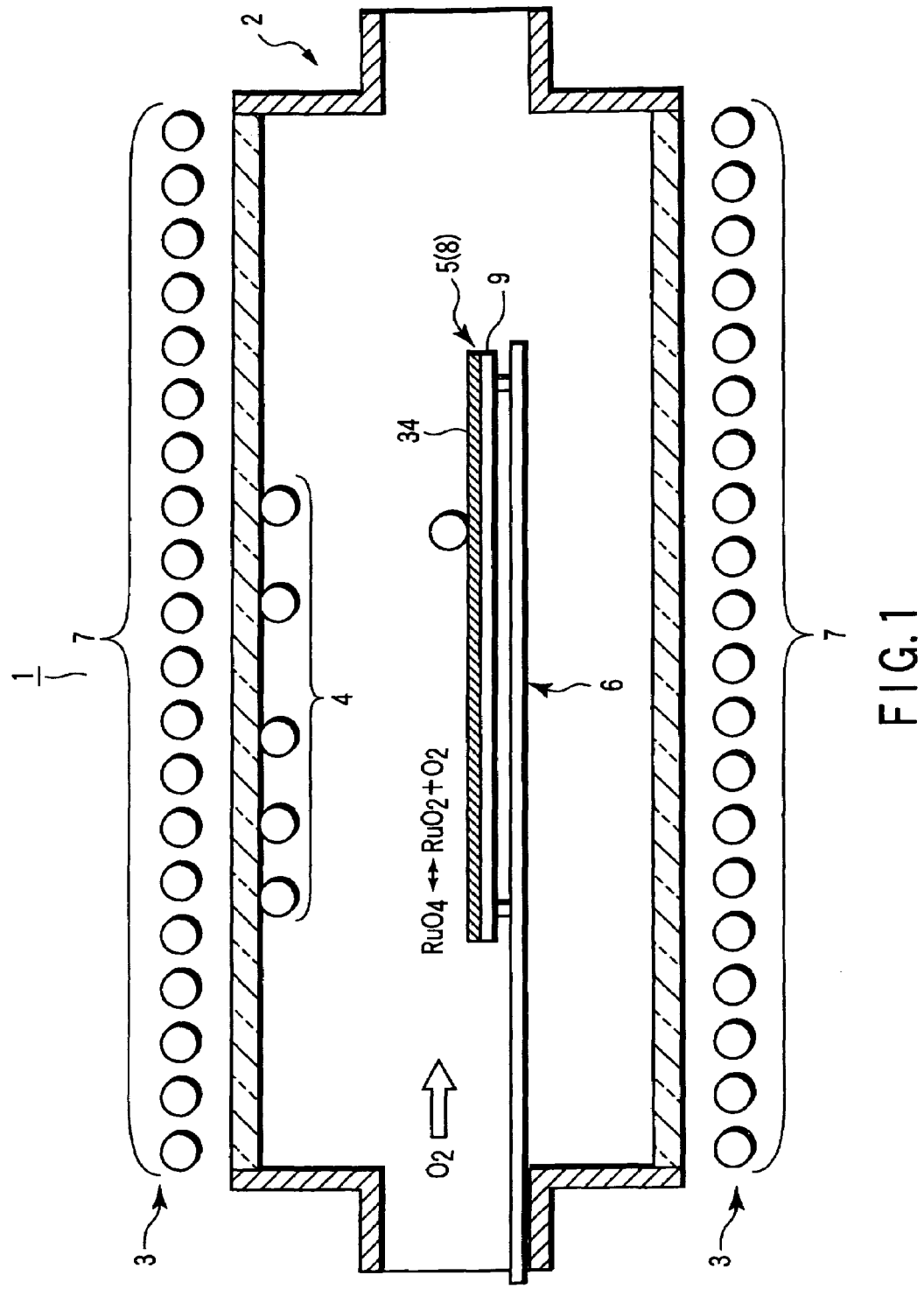
FIG. 1 is a cross-sectional view showing an apparatus for manufacturing a semiconductor device according to one embodiment of the present invention.

First, an apparatus for manufacturing a semiconductor device according to one embodiment will be described referring to FIG. 1. FIG. 1 is a cross-sectional view showing an apparatus for manufacturing a semiconductor device according to one embodiment of the present invention.

As shown in FIG. 1, the apparatus for manufacturing a semiconductor device according to the embodiment (hereinafter, referred simply to as "apparatus") 1 includes a chamber 2, a heater 3 and adsorbent 4. The apparatus 1 is a so-called thermal treatment apparatus (annealer).

The chamber 2 houses a processing substrate (wafer) 5 therein. The wafer 5 includes a film 34 containing a metal element, which is a component of a volatile metal compound. The wafer 5 is housed in the chamber 2, and thereafter, heated. The chamber 2 has the part corresponding to the heater 3 described later, which is formed of materials capable of transmitting thermal rays emitting from the heater, at least. The part corresponding to the heater 3 of the chamber 2 is formed of quartz, for example. The chamber 2 is provided with a support table 6 for supporting the wafer 5.

The above heater 3 is provided outside the chamber 2. The heater 3 heats the wafer 5 housed in the chamber 2. The heater 3 is composed of several heating lamps 7. The heating lamps 7 are arranged so as to simultaneously heat both (front and back) principal surfaces of the wafer 5 housed in the chamber 2. The heating lamps 7 may be xenon lamps or tungsten halogen lamps. By doing so, it is possible to heat the film 34 by heating method calling RTA (Rapid Thermal Anneal) or RTP (Rapid Thermal Process). In other words, the film 34 can be effectively heated for short time.

The adsorbent 4 is provided in the chamber 2 so that it can be freely taken in and out (removable) in order to adsorb the volatile metal compound generated from the film 34 included in the wafer 5 when heating the wafer 5. The adsorbent 4 adsorbs the volatile metal compound generated from the film 34. The volatile metal compound can thereby be prevented from adhering to the surface of the film 34. More specifically, the volatile metal compound adheres to the surface of the film 34. As a result, no crystal particles (abnormal particles) containing metal element of the volatile metal compound will be generated on the surface of the film 34. Thus, the adsorbent 4 may be also called an inhibitor. The adsorbent 4 is previously provided in the chamber at least before the film 34 (i.e., wafer 5) is heated. The crystal particles in the chamber 2 are used as the adsorbent 4, using the volatile metal compound generating from the film 34 as material. The adsorbent 4 remains in the chamber 2 in the method described in the following.

Before the wafer 5 (film 34) is heated, a dummy substrate (dummy wafer) 8 having the same quality film 34 as the film 34 of the wafer 5 is heated in the chamber 2. In this case, the dummy wafer 8 is heated in the same atmosphere as in the actual heating treatment of the wafer 5. By doing so, the gaseous volatile metal compounds are generated from the film 34 of the dummy wafer 8 so that it can adhere to an inner wall surface of the chamber 2.

The volatile metal compound adheres to the inner wall surface of the chamber 2, and thereafter, is decomposed into a gas component and a solid component containing metal elements of the volatile metal compound. The solid component grows as crystal particles 4 in a state of adhering to the inner wall surfaces of the chamber 2, and then, remains on the inner wall surface of the chamber 2. The above-mentioned decomposition reaction is reversible. However, a reverse reaction is hard to occur. In other words, any component is hard to gasify once it is a crystallized (solidified). Therefore, the crystal particles 4, adhering to the inner wall surface of the chamber 2 are hard to revert to the volatile metal compound. In addition, the volatile metal compound can be easily adsorbed to the crystal particles 4 containing the same metal element. For this reason, when the crystal particles 4 is once generated, the volatile metal compounds generating from the film 34 are almost adsorbed to the crystal particles 4. Since the volatile metal compounds adsorbed to the crystal particles 4 cause the decomposition reaction and crystal growth on the crystal particles 4, new crystal particles 4 are formed.

As described above, the decomposition reaction and crystal growth continuously occur while the volatile metal compounds are generated from the film 34. Similarly, the same reaction as described above occurs while the volatile metal compounds are generated from the film 34 when heating the wafer 5. That is, once the crystal particles 4 are formed at portions other than the wafer 5 (film 34), most of the volatile metal compounds to be generated later from the film 34 is consumed as the material for crystal particles 4 growing at the portions other than the wafer 5. Therefore, even if the wafer 5 is repeatedly heated in the chamber 2, there is almost no possibility that the volatile metal compounds are filled or saturated in the chamber 2. In addition, there is almost no possibility that the crystal particles 4 grow in the above reversible reaction (decomposition reaction) at the portions other than the inner wall surface of the chamber 2. In the manner described above, the volatile metal compound generating from the film 34 can be prevented from adhering to the surface of the film 34 when the wafer 5 is heated. As a result, it is possible to prevent the crystal particles 4 containing metal element of the volatile metal compound can be prevented from being generated on the surface of the film 34.

The dummy wafer 8 is heated until the crystal particles 4 adhering to the inner wall surface often chamber 2 reaches a predetermined amount. More specifically, the predetermined amount can adsorb and crystallize the volatile metal compounds generated from each film 34 of the desired number of processed wafers 5. Of course, the predetermined amount previously includes, the crystal particles 4 which have been generated from the volatile metal compound made from the film 34 on each wafer 5 and which function as adsorbent. If the amount of the crystal particles 4 used as adsorbent is smaller than the predetermined amount when only one dummy wafer 8 is heated, several dummy wafers 8 may be heated until the amount of the crystal particles 4 reaches the predetermined amount. As described above, metal compound (crystal particles) 4 are used as adsorbent 4. The metal compound contains metal element, which is a component of the volatile metal compound generated from the film 34 of the wafer 5, and is generated from the volatile metal compound. The detailed component of the above film 34, the volatile metal compound and adsorbent 4, and the chemical reaction taking place in the chamber 2 when the wafer 5 and the dummy wafer 8 are heated will be described, in conjunction with the following method of manufacturing a semiconductor device.

The method of manufacturing a semiconductor device according to one embodiment of the present invention will be described with reference to FIG. 1 to FIG. 3. FIG. 2A to FIG. 2C are cross-sectional views showing the processes in the method of manufacturing a semiconductor device according to the present embodiment. FIG. 3 is a diagram plotting the relationship between the number of particles generated when heating wafer and the number of processed wafers.

The method of manufacturing a semiconductor device according to the present embodiment relates to an annealing process using the annealer 1 described before. In particular, the method of the present invention relates to an annealing process when forming part of a capacitor device electrode having COP type FeRAM memory cell using metal oxide conductor. Tungsten (W) is used as material for forming a contact plug positioned below capacitor device. A lamination film comprising a thin silicon carbide (SiC) film and a thin titanium (Ti) film is interposed between the contact plug and iridium (Ir) film forming part of the lower electrode of capacitor device.

Figure 2A:
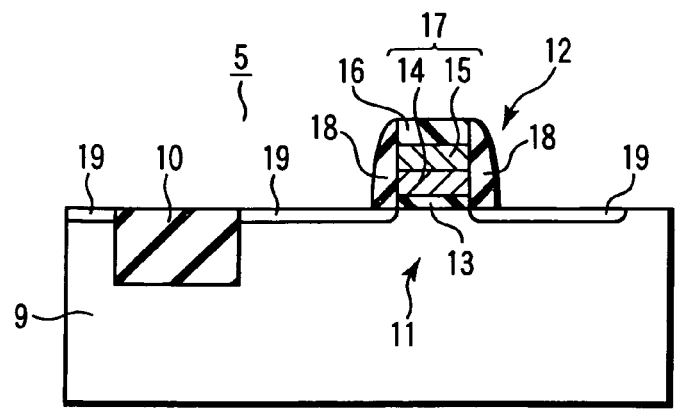
FIG. 2A is a cross-sectional view showing a process in a method of manufacturing a semiconductor device according to one embodiment of the present invention.
Figure 2B:
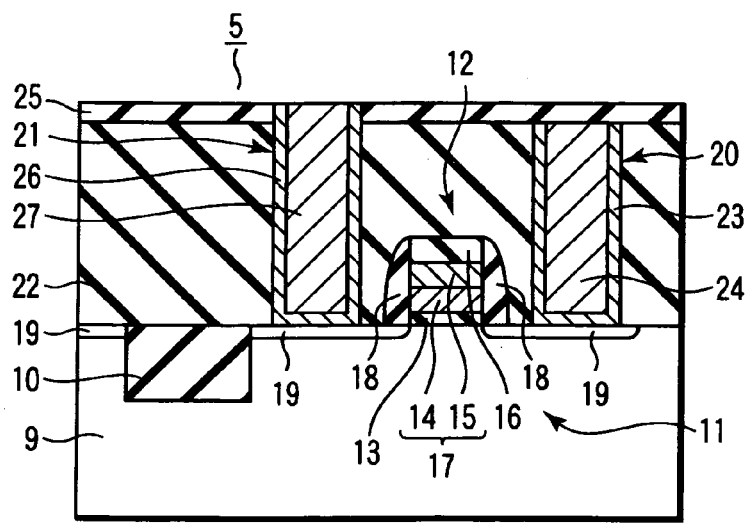
FIG. 2B is a cross-sectional view showing a process in the method of manufacturing a semiconductor device according to one embodiment of the present invention.
Figure 3:
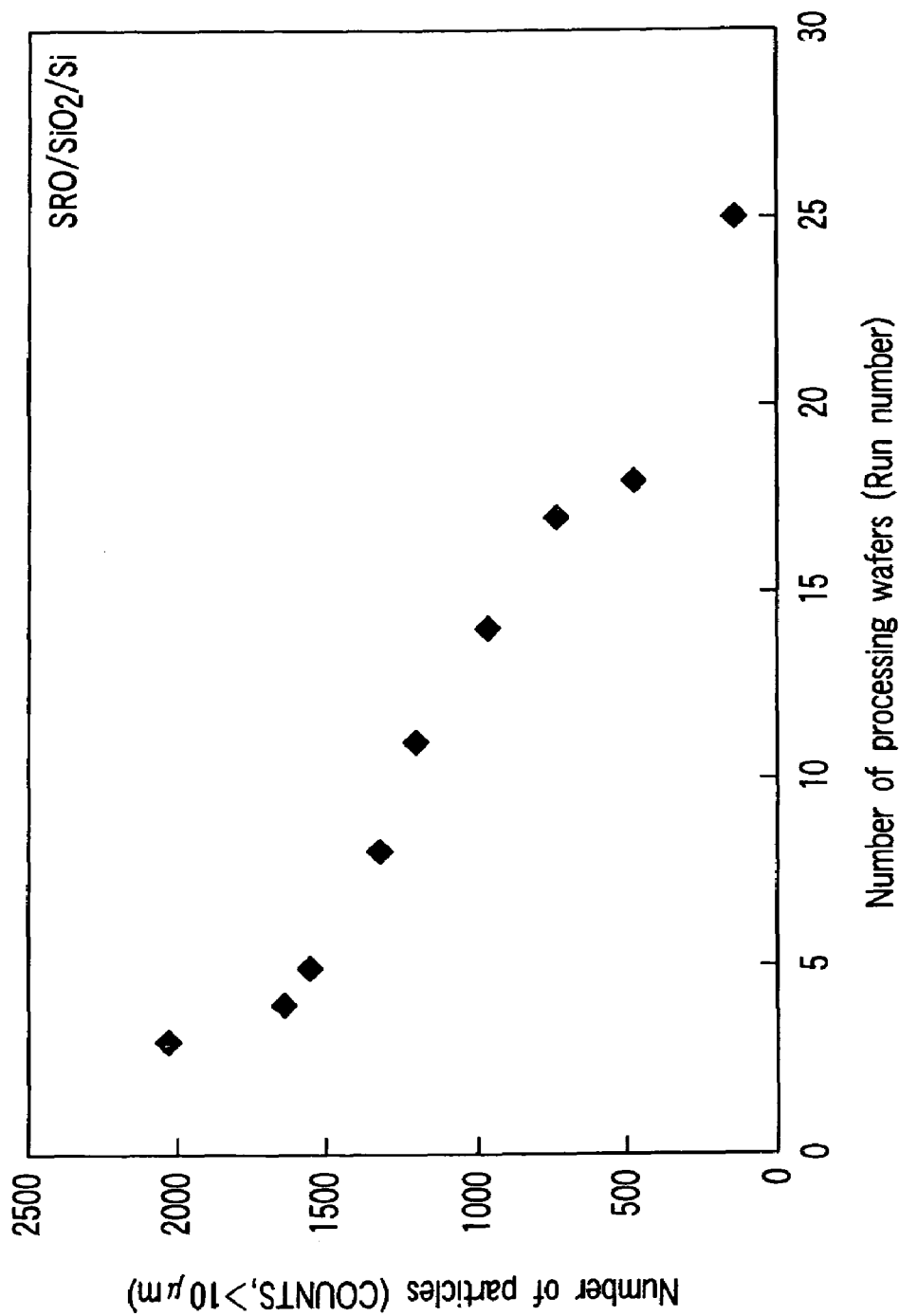
FIG. 3 is a diagram plotting the relationship between the number of particles generated when heating wafer and the number of processing wafers.
Figure 4:
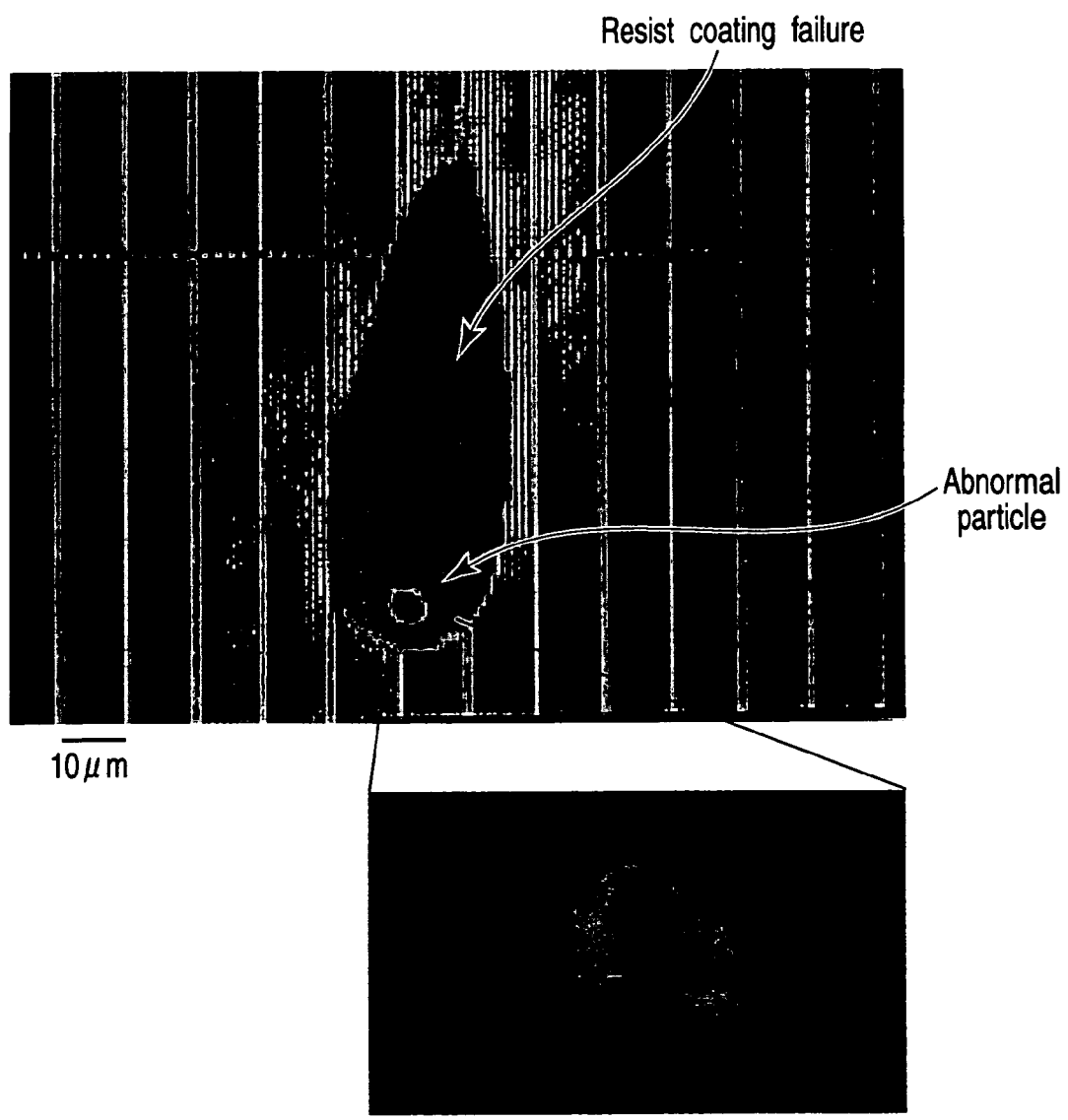
FIG. 4 is a photograph showing abnormal particle generated when heating wafer by a method of manufacturing a semiconductor device according to the conventional technique.

As illustrated in FIG. 2A, shallow trench isolation 10 is formed on the surface layer of a P-type Si substrate main body 9. The shallow trench isolation 10 is formed, burying a $SiO_2$ layer in an isolation trench (not shown) formed at the surface layer of the substrate main body 9. The isolation trench is formed at regions other than transistor active regions formed on the surface layer of the substrate main body 9. Hereinafter, the substrate main body 9 provided with capacitor device 28 and various electronic devices described later is referred to as processing substrate (wafer) 5.

A transistor 12 for making a switch operation is formed on the surface layer of the substrate main body 9. An oxide film 13 of, for example, $SiO_2$ is formed on the entire surface of the substrate main body 9 by hot oxidation until it has a film thickness of about 6 nm. An arsenic (As)-doped n+ type polycrystalline silicon film 14 is formed on the entire surface of the $SiO_2$ film 13. A $WSi_X$ film 15 and a nitride film 16 such as SiN are further formed on the surface of the polycrystalline silicon film 14. The polycrystalline silicon film 14, $WSi_X$ film 15 and SiN nitride film 16 are processed by normal photolithography and RIE. A gate electrode 17 is thereby formed on the surface of the substrate main body 9. A nitride film 18 such as SiN is deposited on the surface of the substrate main body 9 and covers the gate electrode 17. Thereafter, the SiN film 18 is processed by RIE, i.e., normal process of leaving sidewalls. The sidewall of the gate electrode 17 is therefore provided with a spacer 18. A source/drain region 19 is formed on the surface layer of the substrate main body 9 by normal ion implantation and thermal treatment, which is not described here. As a result, the transistor 12 is formed on the surface layer of the substrate main body 9.

As seen from FIG. 2B, contact plugs 20 and 21 are formed on the surface of the substrate main body 9 having the transistor 12, in the following manner. First, an oxide film (d-TEOS film) such as $SiO_2$ is deposited on the entire surface of the substrate main body 9 by CVD process so as to cover the transistor 12. Thereafter, the surface of the d-TEOS film 22 is temporarily planarized by CMP process. A contact hole (not shown) through the d-TEOS film 22 is made, exposing one surface of the source/drain region 19 exposed. A thin titanium (Ti) film is deposited in the contact hole and on the surface of the d-TEOS film 22 by sputtering or CVD. Thereafter, the Ti film 23 is heated in a predetermined forming gas, forming a TiN film 23 can be formed. Tungsten (W) 24 is deposited on the entire surface of the TiN film 23 by CVD. Thereafter, CMP is performed, removing extra TiN film 23 and tungsten 24 from the surface of the d-TEOS film 22. The TiN film 23 and tungsten 24 is therefore buried in the contact hole. Thus, one contact plug 20 electrically connected to one of the source/drain region 19 is formed.

A nitride film 25 such as SiN is deposited on the entire surface of the d-TEOS film 22 formed with the contact plug 20 by CVD. Thereafter, the other contact plug 21 electrically connected to the other of the source/drain region 19 is formed according to the same method as forming the above contact plug 20. First, a contact hole (not shown) is made in the SiN film 25 and the d-TEOS film 22, exposing the other surface of the source/drain region 19. A thin TiN film 26 is formed in the contact hole and on the surface of the SiN film 25. Tungsten (W) 27 is deposited on the entire surface of the TiN film 26. Thereafter, CMP is performed, burying the TiN film 26 and tungsten 27 are buried in the contact hole. Another contact plug 21 electrically connected to the other of the source/drain region 19 is thereby formed. The contact plug 21 thus formed is electrically connected to capacitor device 28, which will be described later.

Figure 2C:
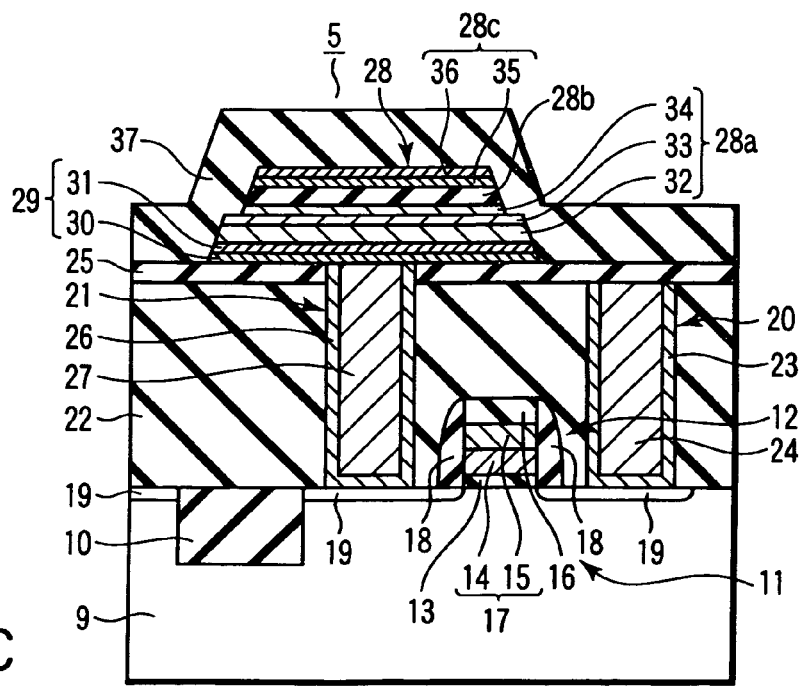
FIG. 2C is a cross-sectional view showing a process in the method of manufacturing a semiconductor device according to one embodiment of the present invention.

As depicted in FIG. 2C, a capacitor device 28 is formed on the SiN film 25 having the contact plug 21. Before forming the capacitor device 28, a front-end layer 29 of the capacitor device 28 is formed on the surface of the contact plug 21 and the SiN film 25, in the following manner. First, a silicon carbide film (SiC) 30 is deposited by sputtering, on the entire surface of the SiN film 25 until it has a film thickness of about 10 nm. Further, a titanium (Ti) film 31 is deposited by sputtering, on the entire surface of the SiC film 30 until it has a film thickness of about 3 nm. The front-end layer 29 of the capacitor device 28 comprising the lamination film of SiC film 30 and Ti film 31 is thereby formed.

The lower electrode 28a of the capacitor device 28 is formed on the surface of the Ti film 31 in the following manner. First, an iridium (Ir) film 32 is deposited by sputtering, on the entire surface of the Ti film 31 until it has a film thickness of about 30 nm. Similarly, a first platinum (Pt) film 33 is deposited by sputtering, on the entire surface of the Ir film 32 until it has a film thickness of about 20 nm. Further, a metal oxide film, that is, first $SrRuO_3$ (SRO) film 34 is formed by sputtering, on the surface of the Pt film 33 until it has a film thickness of about 10 nm. The first SRO film 34 is a portion film) contacting with a capacitor insulating film 28b described later of the capacitor electrode 28a. In this case, the SRO film 34 is formed within a temperature range from room temperature to about 600° C.

In order to develop electric conductivity in the SRO film 34, the SRO film 34 is crystallized. More specifically, the chamber 2 of the annealer 1 is filled with oxygen ($O_2$). The SRO film 34 is heated within a temperature range from about 550 to 650° C. The SRO film 34 is therefore crystallized. The crystallization will be described in detail.

One component of the SRO film 34, or, Ru (ruthenium), is easy to generate the volatile metal compound, i.e., $RuO_4$ in heating process. The $RuO_4$ generates $RuO_X$ crystal particles (abnormal particles) after decomposed on the SRO film 34, as in the conventional technique. More specifically, a chemical reaction expressed by the following chemical formula occurs on the surface of the SRO film 34 based on $RuO_4$ generated from the SRO film 34.

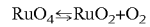

$$RuO_4 \leftrightarrows RuO_2 + O_2$$

The $RuO_2$ crystal particles have a diameter of about 0.5 μm or more even if they are small. For this reason, it is almost impossible to remove the $RuO_2$ crystal particles generated on the surface SRO film 34 can hardly be removed from there by after-cleaning process. The $RuO_2$ crystal particles on the surface SRO film 34 may cause the operation failure of the capacitor device 28. In addition, the $RuO_2$ crystal particles may degrade the performance, quality, and reliability of the semiconductor device. Consequently, the yield of the semiconductor device will decrease, and the manufacturing cost of the semiconductor device will increase.

As seen from the chemical formula, the decomposition reaction of $RuO_4$ is a reversible reaction. However, the reverse reaction of the decomposition reaction, that is, the formation reaction of $RuO_4$ is hard to occur. In other words, the $RuO_2$ crystal particles are hard to revert to $RuO_4$. The $RuO_4$ is easy to be adsorbed to the $RuO_2$ crystal particles containing Ru. Thus, if the $RuO_2$ crystal particles exist in the atmosphere (reaction system) where the above reversible reaction occurs, the $RuO_4$ is mostly adsorbed to the $RuO_2$ crystal particles. The $RuO_4$ adsorbed to the $RuO_2$ crystal particles make the above decomposition reaction and crystal growth on the $RuO_2$ crystal particles; as a result, it becomes new $RuO_2$ crystal particles. The decomposition reaction and crystal growth continuously takes place while the $RuO_4$ is generated. Namely, if the $RuO_2$ crystal particles exist on portions other than the wafer 5 (SRO film 34), the $RuO_4$ can be prevented from adhering to the surface of the SRO film 34. As a result, the $RuO_2$ crystal particles can be prevented from being generated on the surface of the SRO film 34. Therefore, in the heating process of the SRO film 34, the above properties of $RuO_4$ and $RuO_2$ are used, and thereby, the $RuO_2$ crystal particles can be prevented from being generated on the surface of the SRO film 34.

More specifically, as shown in FIG. 1, before the wafer 5, which will be product, is heated, the dummy wafer 8 provided with the SRO film 34 is heated in the chamber 2 in the same manner as the wafer 5. In this case, oxygen is previously supplied into the chamber 2, and then, the dummy wafer 8 is heated at the temperature of about 500° C. That is, before the wafer 5 is actually heated, the dummy wafer 8 is heated under substantially the same oxygen atmosphere as heating to the wafer 5. $RuO_4$ is thereby generated from the SRO film 34 of the dummy wafer 8 and can adhere to the inner wall surface of the chamber 2. The $RuO_4$ adhering to the inner wall surface of the chamber 2 is decomposed into $RuO_2$ and $O_2$. The $RuO_4$ grows as crystal particle in a state of adhering to the inner wall surface of the chamber 2, and thereafter, remains on the inner wall surface of the chamber 2. By doing so, $RuO_2$ crystal particles used as adsorbent 4 is provided on the inner wall surface of the chamber 2.

Heating to the dummy wafer 8 ends after the amount of the $RuO_4$ crystal particles adhering to the inner wall surface of the chamber 2 reaches the amount capable of mostly adsorbing and crystallizing RuO4 generated from the SRO films of the desired number of wafers 5. In other words, the supply of the $RuO_2$ crystal particles 4 used as adsorbent to the inside of the chamber 2 is completed. Thereafter, in the process of heating the wafer 5, the $RuO_4$ generated from the SRO film 34 is adsorbed to the $RuO_2$ crystal particles 4, and thereby, the $RuO_4$ can be prevented from adhering to the surface of the SRO film 34 of the wafer 5. In addition, the $RuO_2$ crystal particles can be prevented from being generated in the chamber 2. As a result, the $RuO_2$ crystal particles (abnormal particles) can be prevented from being generated on the surface of SRO film 34 of the wafer 5.

Here, the experiment conducted by the present inventors will be described below with reference to FIG. 3. The present inventors heated the dummy wafer 8 provided with the SRO film 34 in the chamber 2, and thereafter, investigated the relationship between the number of processed wafers and the number of $RuO_2$ crystal particles generated on the surface of the SRO film 34. FIG. 3 is a diagram plotting the relationship between the number of $RuO_2$ crystal particles generated when heating the dummy wafer 8 and the number of processed dummy wafers 8. In this case, only $RuO_2$ crystal particles having grain size larger than 10 µm or more was counted. As is evident from FIG. 3, according to the experiment conducted by the present inventors, with the increase of the number of processed dummy wafers 8, the number of generated $RuO_2$ crystal particles decreased. According to the conventional annealing carried out by the present inventors, about 10 $RuO_2$ crystal particles per wafer constantly adhered to the surface of the SRO film 34. According to the annealing process of the embodiment, it was found that the number of $RuO_2$ crystal particles adhered onto the surface of the SRO film 34 was reduced to about one or two per wafer. Therefore, according to the annealing process of the embodiment, it was found that the generated number of $RuO_2$ crystal particles could be greatly reduced. Namely, it was found that the number of $RuO_2$ crystal particles adhering to the wafer could greatly be reduced.

After the predetermined amount of $RuO_2$ crystal particles adhere to the inner wall surface of the chamber 2, heating to the wafer 5 is started. By doing so, the SRO film 34 of the wafer 5 is crystallized in a proper and clean state and has electric conductivity. Thus, the capacitor electrode 28a comprising the lamination film of the above Ir film 32, Pt film 33 and first SRO film (SRO electrode) 34 is formed on the front-end layer 29 comprising the lamination film of the above SiC film 30 and Ti film 31. Almost no $RuO_2$ crystal particles adhere to the surface of the crystallized first SRO film 34, so that clean state is given. Therefore, the SRO film 34 would not reduce electrical characteristics of the insulating film 28b of the capacitor device 28 formed contacting with the surface. In addition, the electrical characteristics of the interface between the SRO film 34 and the capacitor insulating film 28b are scarcely degraded. Namely, this means that the first SRO film 34 is good quality as the constituent component of the capacitor lower electrode 28a. Consequently, the capacitor lower electrode 28a having the above first SRO film 34 is also good quality.

In this case, rapid thermal annealing (RTA) is performed to crystallize the first SRO film 34. By doing so, it is possible to reduce damages by heat given to the first SRO film 34.

The capacitor insulating film (capacitor ferroelectric film) 28b, that is, PZT film (Pb—Zr—Ti—O film) is formed on the surface of the first SRO film 34 by sputtering. The PZT film 28b is temporally subjected to RTA under the oxygen atmosphere, and thereby, the PZT film 28b is crystallized. The PZT film 28b is crystallized by using the annealer 1.

An upper electrode 28c of the capacitor electrode 28 is formed on the surface of the PZT film 28b, in the following manner. First, a second SRO film 35 having a thickness of about 10 nm is formed on the surface of the PZT film 28b according to the same method as forming the first SRO film 34. The second SRO film 35 is a portion (film) contacting with the capacitor insulating film 28b of the capacitor upper electrode 28c. In this case, heating for crystallizing the second SRO film 35 is carried out using the annealer 1. In the heating process, RTA is employed. This reduces damages by heat given to the second SRO film 35.

The amount of $RuO_2$ crystal particle 4 adheres to the inner wall surface of the chamber 2 before heating the first SRO film 34. Of course, the amount includes an amount enough to mostly adsorb and crystallize $RuO_4$ generated from the second SRO film 35 of the desired number of wafers 5. However, in the actual heating process of the second SRO film 35, the $RuO_2$ crystal particles 4 previously adhering to the inner wall surface of the chamber 2 and $RuO_2$ particles, which are new crystal particles 4 generated in the heating process of the first SRO film 34, function as the adsorbent 4. Therefore, the amount of the $RuO_2$ crystal particle 4 previously adhering to the inner wall surface of the chamber 2 before heating the first SRO film 34 is set as follows. That is, the amount of $RuO_2$ crystal particle 4 is sufficient so long as it can mostly adsorb and crystallize $RuO_4$ generated from the first SRO film 34 of the desired number of wafers 5.

A second platinum (Pt) film 36 is formed by sputtering, on the SRO film 35. The capacitor upper electrode 28c comprising lamination film of the second SRO film (SRO electrode) 35 and the second PT film 36 is thereby formed on the surface of the PZT film 28b.

Thereafter, oxide film (SiO₂ film) (not shown) is temporally deposited as processing mask material on the surface of the SiN film 25 by CVD process to cover the front-end layer 29, capacitor lower electrode 28a, capacitor ferroelectric film 28b and capacitor upper electrode 28c. The SiO₂ film is patterned while photo resist film (not shown) being removed by normal photolithography and RIE. Thereafter, the second Pt film 36, second SRO film 35, PZT film 28b and first SRO film 34 are shaped after being etched by RIE. The above first Pt film 33, Ir film 32, Ti film 31 and SiC film 30 are shaped after being successively patterned by photolithography and RIE processes. The process is carried out, and thereby, the capacitor device 28 having the desired size and shape can be formed on the front-end layer 29.

As illustrated in FIG. 2C, an oxide film (d-TEOS film) 37 such as SiO₂ is deposited on the surface of the SiN film 25 by CVD to cover the capacitor device 28. Under oxygen atmosphere, the d-TEOS film 37 is heated at about 600° C. This serves to reduce damages given to the PZT film 28b in the above-mentioned processing and shaping. When the heating process is completed, the process of forming the capacitor device 28 ends. In this case, too, the heating process is performed by the annealer 1.

In the heating process, the oxygen permeates through the capacitor device 28 contribute to the recovery of damages to the PZT film 28b. Further, part of oxygen permeates through the capacitor lower electrode 28a. On the other hand, the Ir film 32 has oxygen diffusion inhibitory effect in some degree by itself. In addition, the lamination film (front-end layer) 29 comprising the Ti film 31 and SiO film 30 has diffusion barrier properties. Thus, there is almost no possibility that the contact plug 21 provided below the capacitor device 28 is oxidized. The lamination film 29 comprising the Ti film 31 and SiO film 30 hardly reacts with the Ir film 32, first Pt film 33 or tungsten plug 21. Therefore, the heating process and each heating process in the oxygen atmosphere, in the manufacturing process of the capacitor device 28, scarcely cause hindrance to the capacitor device 28.

Thereafter, a desired COP type FeRAM is formed via the following processes, although illustration and details are omitted. Among the processes are: a process of forming a contact plug connected to the upper electrode of the capacitor device 28, a process of forming drive lines and bit lines, and a process of forming upper-layer metal interconnects. Thus, the process of manufacturing the semiconductor device according to the embodiment ends.

As described above, according to one embodiment, in the heating process for crystallizing the first and second SRO films 34 and 35, it is possible to prevent RuO₄ from being generated from each of the SRO films 34 and 35. In addition, RuO₂ crystal particles (abnormal particles) generated from RuO₄ can be prevented from occurring on each surface of the SRO films 34 and 35. Namely, the SRO films 34 and 35 have a clean surface having almost no unnecessary adherent substances (impurities); therefore, good-quality thin SRO films 34 and 35 can be stably formed.

With the increase of the number of processing times of wafer 5, the amount of RuO₂ crystal particles adhering to the inner wall surface of the chamber 2 increases. In other words, with the increase of the number of processing times of wafer 5, the amount of adsorbent (inhibitor) 4 increases. Therefore, with the increase of the number of processing times of wafer 5, each surface of the first and second SRO films 34 and 35 becomes clean. As a result, with the increase of the number of processing times of wafer 5, good-quality thin SRO films 34 and 35 can be stably formed.

In the FeRAM using ferroelectric film as the capacitor insulating film, a material hard to reduce electrical characteristics of the capacitor ferroelectric film is usually used as the portion contacting the capacitor ferroelectric film of the capacitor electrode. By doing so, the reliability of the capacitor device can be secured. For example, if one of metal oxide ferroelectric films, that is, PZT film is used as the capacitor ferroelectric film, it is general to use the SRO film as the portion contacting the PZT film of the capacitor electrode. As described above, according to the present embodiment, good-quality thin SRO films 34 and 35 is stably formed; therefore, it is possible to prevent the reduction of electrical characteristics of the PZT film 28b and the operation failure of the capacitor device 28. As a result, it is possible to improve performance, quality and reliability of the COP type FeRAM that has the capacitor device 28. In addition, it is possible to improve the FeRAM yield, and to reduce the manufacturing cost of the FeRAM.

The annealer 1 is used in all heating processes of crystallizing the PZT film 28b, and thereby, it is possible to simplify and fast perform the process of manufacturing the above COP type FeRAM. In addition, the FeRAM manufacturing system including the annealer 1 can be simplified. It is therefore possible to improve production efficiency of FeRAM, and to reduce the manufacturing cost thereof.

The apparatus and method for manufacturing a semiconductor device according to the present invention is not limited to the above-mentioned embodiment. Various modifications of the constitution or part of processes may be made without departing from the scope of the inventive concept, or various setups may be properly combined.

For instance, in the front-end layer 29 of the capacitor device 28, the Ti film 31 is formed on the SiO film 30; however, the film formed on SiO film 30 is not limited to the Ti film 31. In place of the Ti film 31, for example, Zr, Hf, V, Nb or Ta films may be formed on the SiO film 30. In other words, the portion contacting with the capacitor lower electrode 28a of the front-end layer 29 may be formed of materials containing metal elements of at least one kind of groups IV-B and V-B.

The PZT film is sued as the capacitor ferroelectric film 28b; however, the ferroelectric film is not limited to the PZT film. In place of the PZT film, for example, an Sr—Bi—Ta—O film (SBT film) may be used as the same ferroelectric film. The crystallization temperature of the SBT film is higher than that of the PZT film. For this reason, in order to properly form the STB film, heating at a temperature higher than the PZT film is required. However, according to the present invention, the same effect as the case of employing the PZT film can be obtained.

Besides, Ba—Sr—Ti—O film (BST film) and Sr—Ti—O film (STO film) containing alkaline earth metal elements such as Ba and Sr may be sued as the above capacitor ferroelectric film 28b. the above PZT, SBT, BST and STO are ferroelectric films having a so-called perovskite-type crystal structure. If the ferroelectric films having so-called perovskite-type crystal structure are used as ferroelectric film, at least one metal element forming the A site is used, which is selected from groups II-A, III-B and IV-A as metal element forming the A site. Similarly, if the ferroelectric films having so-called perovskite-type crystal structure are used as ferroelectric film, at least one metal element forming the B site is used, which is selected from groups IV-B and V-B as metal element forming the B site. For example, Zr, La, Nb or Sn is given in addition to the above metal elements. Pb—Ti—O (PT film), BaTiO$_3$, PbZnO$_3$, Ta$_2$O$_5$ or Bi$_4$Ti$_3$O$_{12}$ films may be used as the above capacitor ferroelectric film 28b.

The capacitor ferroelectric film 28b is not limited to ferroelectric films. Normal dielectric films may be used.

The heating process for crystallizing the first and second SRO films 34 and 35 is not limited to the temperature range from about 550 to 650° C. described before. According to the experiment conducted by the present inventors, it was found that the same particles inhibitory effect as the heating process at the above temperature range was obtained in the heating process at the temperature range from about 450 to 700° C. obtained.

The first and second Pt films 33 and 36 are used as part of the capacitor lower and upper electrodes 28a and 28c; however, the capacitor electrode is not limited to the above Pt films 33 and 36. In place of the Pt films 33 and 36, for example, single metal films such as Ir film and Ru film may be used. In addition, conductor films comprising of metal compound (metal oxide) such as strontium ruthenium oxide may be used. Namely, in the capacitor lower and upper electrodes 28a and 28c, the portion provided with the Pt films 33 and 36 may be formed of materials containing metal elements included in at least one kind of groups II-A and VIII.

The first and second SRO films 34 and 35 are used as the portion (film) contacting with the capacitor insulating film 28b of the capacitor lower and upper electrodes 28a and 28c; however, the contacting portion is not limited to the SRO films 34 and 35. In addition to the above SRO films 34 and 35, the following film may be used. That is, the film is formed of materials containing predetermined noble metal elements having the volatile metal compound component or metal elements having high melting point. More specifically, in place of the SRO films 34 and 35, the film may be formed of material containing at least one metal element selected from groups II-A, IV-B, VII-B, VIII and I-B. For example, the film may be formed of material containing at least one metal element of Ru, sr, Ti, Pt, Re, Ir, Os, Pd, Rh and Au.

The experiment conducted by the present inventors showed that the same effect as the SRO films 34 and 35 was obtained even if the film formed of material containing at least one of the metal elements given above was used in place of the SRO films 34 and 35. Further, it was found that the film used in place of the SRO films 34 and 35 could obtain the same effect as the SRO films 34 and 35 so long as the film contains at least one of the metal elements given above even if it is formed of a single metal. Further, if the film used in place of the SRO films 34 and 35 was formed of metal compound conductor, it was found that the metal compound should be metal oxide.

The adsorbent 4 supplied into the chamber 2 is not limited to the RuO$_2$ described before. The adsorbent 4 may contain at least one of the metal elements given above contained in the portion contacting with the capacitor insulating film 28b of the capacitor lower and upper electrodes 28a and 28c. The experiment conducted by the present inventors confirmed that the same effect was obtained even if the adsorbent 4 was either single metal or metal compound. If the adsorbent 4 was metal compound, it was confirmed that the metal compound should be metal oxide. Further, according to the experiment conducted by the present inventors, it was confirmed that the adsorbent 4 might contain at least one metal element of IV-B in addition to the metal elements given above. For example, Ti is given as the metal element. In either case, the adsorbent 4 supplied into the chamber 2 may be any other forms so long as it can develop the same action and effect as the adsorbent 4.

The method of providing (supplying) the adsorbent 4 in the chamber 2 is not limited to the process of heating the dummy wafer 8. For example, heating to the dummy wafer 8 has no need to be carried out under the same atmosphere as actual heating to wafer 5 so long as the adsorbent is obtained. Another method of providing the adsorbent 4 in the chamber 2 may be performed, in which the adsorbent 4 is directly coated onto the inner wall surface of the chamber 2. Further, the adsorbent 4 may adhere to the inner wall surface of the chamber 2 by sputtering and CVD processes. Further, the gaseous volatile metal compound is supplied into the chamber 2 so that the volatile metal compound can adhere to the inner wall surface of the chamber 2, thereafter, the metal compound may be crystallized as the adsorbent 4.

The place provided with the adsorbent 4 is not limited to the inner wall surface of the chamber 2. For example, the adsorbent 4 may adhere to the support table 6. Further, the chamber 2 is provided with an adsorbent holder (not shown), and thereby, the adsorbent 4 may be held onto the adsorbent holder. In addition, the adsorbent 4 adheres to the inner wall surface of the chamber 2, the heater 3 does not properly heat the wafer 5. In this case, the adsorbent 4 is applied to portions of the inner wall surface, but not to the part facing the heater 3.

The adsorbent 4 has no need to be always provided in the chamber 2. In this case, the following proper amount of adsorbent 4 is supplied into the chamber (processing atmosphere). The proper amount is an amount capable of adsorbing the volatile metal compounds generated from the film 34 and 35 when heating the portions (films) 34 and 35 contacting with the capacitor insulating film 28b between the upper and lower capacitor electrodes 28c and 28a. That is, when heating the film containing metal elements having the volatile metal compound component, the proper amount of adsorbent capable of adsorbing the volatile metal compounds generated from the film is supplied into the chamber 2.

With the increase of the number of processing times of wafers 5, the amount of RuO$_2$ crystal particle 4 adhering to the inner wall surface of the chamber 2 increases. In other words, with the increase of the number of processing times of wafers 5, the amount of adsorbent (inhibitor) 4 in the chamber 2 increases. Therefore, with the increase of the number of processing times of wafers 5, each surface of the first and second SRO films 34 and 35 becomes cleaner. In other words, with the increase of the number of processing times of wafers 5, high-quality thin SRO films 34 and 35 can be stably formed. Consequently, before heating to the wafer 5, there is no need of previously providing the amount of adsorbent 4 capable of adsorbing RuO$_4$ generated from all SRO films 34 and 35 of the desired number of wafers 5 in the chamber 2.

The method of providing a large amount of RuO$_2$ crystal particles 4 into the inner wall surface of the chamber 2 is not limited to the method of heating several dummy wafers 8. For example, the thickness of the film 34 provided in one dummy wafer 8 is set thicker than that provided in wafer 5.

In this case, the film thickness is set so that the amount of RuO$_2$ crystal particle 4 adhering to the inner wall surface of the chamber 2 reaches the predetermined amount described before by one-time heating to the dummy wafer 8. It is therefore possible to shorten time spent for the process of providing the adsorbent 4 in the chamber 2. This can contribute to improving the productivity of semiconductor devices.

After heating to the desired number of wafers 5 is completed, it is desirable that the chamber 2 is supplied with etching gas capable of removing the adsorbent 4 adhered in the chamber 2. In this case, the component, flow rate, temperature and pressure of the etching gas are set to the condition capable of mostly removing the adsorbent 4 remaining in the chamber 2. By doing so, the used chamber 2 is cleaned, so that the chamber 2 can be held at a clean state as non-used. In addition, the inside of the using chamber 2 can be set to proper and clean conditions. Several processing substrate (wafers) 5 have mutually different metal compound films 34, and each substrate is continuously heated. In this case, the inside of the chamber 2 is cleaned by etching gas every when heating to each substrate 5. The film 34 of each substrate 5 can be therefore continuously heated in proper and clean conditions. The adsorbent 4 is provided so that it can be freely taken in and out (removable). The adsorbent 4 comprising of material corresponding to the volatile metal compound to be adsorbed is used. By doing so, the adsorbing action and effect of the adsorbent 4 can be effectively developed with respect to various volatile metal compounds.

The shape of the capacitor device 28 is not limited to the plane type described before. The capacitor device 28 may be formed into a so-called stack type. More specifically, the capacitor device 28 may be formed into various solid shapes such as so-called cylinder, concave, convex or pedestal types.

The process of manufacturing the semiconductor device to which the present invention is applied is not limited to the portion (film) contacting with the capacitor insulating film 28b between the capacitor lower and upper electrode 28a and 28c. From the same reason as described before, the present invention is applicable to heating processes for various members in which particles will be generated. In addition, the semiconductor device formed according to the present invention is not limited to the above-mentioned COP type FeRAM. For example, DRAM and MRAM having the capacitor insulating film 28b formed of normal dielectrics can be manufactured according to the present invention. Further, the semiconductor device formed according to the present invention is not limited to memory type semiconductor devices. For example, CPUs can be of course manufactured according to the present invention.

The above heating process is not limited to RTA (RTP). A so-called spike anneal may be employed which can carry out heating in shorter time. The apparatus (annealer) 1 for manufacturing the semiconductor device is not limited to the heater using lamps such as rapid thermal annealer (RTA) (rapid thermal processor (RTP). The apparatus 1 for manufacturing the semiconductor device may be a furnace, for example. In addition, the apparatus 1 for manufacturing the semiconductor device may be configured as a heater combining the rapid thermal annealer (RTA). The apparatus 1 for manufacturing the semiconductor device may be either single wafer processing type or batch processing type.

As described above, the apparatus and method for manufacturing the semiconductor device according to the present invention is not limited to the above embodiment. When the processing substrate provided with film containing metal element having the volatile metal compound component is heated, the volatile metal compound generated from the film is prevented from adhering to the surface of the film. Therefore, clean conductive films can be formed. In addition, the semiconductor device according to the present invention includes a semiconductor substrate having the following conductive films. The conductive films contain metal element having the volatile metal compound component. They are formed at a clean state, preventing the volatile metal compound from adhering to the surface of the films.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for heat treating a thin film, comprising:
    a chamber which holds a to-be-processed substrate having
        a film containing at least one kind of metal element which will become a component of a volatile metal compound;
    a heater which heats the substrate held in the chamber; and
    a solid adsorbent which is provided in the chamber to prevent particles from being formed on the substrate by at least one of adhesion on the substrate and nucleation and growth on the substrate while heating the substrate and which adsorbs the volatile metal compound generated from the film by heating the substrate.

2. The apparatus according to claim 1, wherein the film is made of the metal element or a metal compound containing the metal element.

3. The apparatus according to claim 1, wherein the metal element is at least one kind of metal element included in groups II-A, IV-B, VII-B, VIII and I-B.

4. The apparatus according to claim 1, wherein the solid adsorbent contains the metal element.

5. The apparatus according to claim 1, wherein the solid adsorbent contains at least one kind of metal element of a group IV-B.

6. The apparatus according to claim 1, wherein the solid adsorbent adheres to an inner wall surface of the chamber.

7. The apparatus according to claim 3, wherein the metal element is at least one of Ru, Sr, Ti, Pt, Re, Ir, Os, Pb, Rh and Au.

8. The apparatus according to claim 4, wherein the solid adsorbent is a metal compound containing the metal element.

9. The apparatus according to claim 5, wherein the solid adsorbent is Ti.

10. A method of heat treating a thin film, comprising:
    providing a solid adsorbent in a chamber to prevent particles from being formed on a to-be-processed substrate by at least one of adhesion on the substrate and nucleation and growth on the substrate while heating the substrate, the chamber holding the substrate and heating the substrate, and the substrate having a film containing at least one kind of metal element which will become a component of a volatile metal compound; and causing the solid adsorbent to adsorb the volatile metal compound generated from the film by heating the substrate.

11. The method according to claim 10, wherein a dummy substrate having a film containing the metal element is heated in the chamber and the solid adsorbent adheres to an inner wall surface of the chamber.

12. The method according to claim 10, wherein the solid adsorbent is deposited directly on an inner wall surface of the chamber and adheres thereto.

13. The method according to claim 10, wherein the solid adsorbent is applied to an inner wall surface of the chamber by sputtering or CVD.

14. The apparatus according to claim 1, wherein the solid adsorbent is provided separately from the to-be-processed substrate.

15. The method according to claim 10, wherein the solid adsorbent is provided separately from the to-be-processed substrate.

* * * * *